(12) United States Patent
Kermani

(10) Patent No.: US 6,362,674 B1
(45) Date of Patent: Mar. 26, 2002

(54) METHOD AND APPARATUS FOR PROVIDING NOISE IMMUNITY FOR A BINARY SIGNAL PATH ON A CHIP

(75) Inventor: Bahram Ghaffarzadeh Kermani, Whitehall, PA (US)

(73) Assignee: Agere Systems Guardian Corp., Orlando, FL (US)

(*) Notice: Subject to any disclaimer, the term of this patent is extended or adjusted under 35 U.S.C. 154(b) by 0 days.

(21) Appl. No.: 09/236,178

(22) Filed: Jan. 25, 1999

(51) Int. Cl.[7] .............................................. H03K 3/037
(52) U.S. Cl. ......................................... 327/217; 327/34
(58) Field of Search ........................ 327/34, 217, 165, 327/166, 178, 551; 326/94

(56) References Cited

U.S. PATENT DOCUMENTS

| | | | | |
|---|---|---|---|---|
| 4,525,635 A | * | 6/1985 | Gillberg | 327/217 |
| 5,729,449 A | * | 3/1998 | Takaka et al. | 363/98 |
| 5,739,706 A | * | 4/1998 | Okamoto | 327/309 |
| 5,889,429 A | * | 3/1999 | Kobayashi et al. | 327/540 |
| 5,955,901 A | * | 9/1999 | Kikuchi et al. | 327/107 |

FOREIGN PATENT DOCUMENTS

| | | | | |
|---|---|---|---|---|
| JP | 3-91314 | * | 4/1991 | 327/217 |
| JP | 403258015 | * | 11/1991 | 327/564 |

* cited by examiner

*Primary Examiner*—Tuan T. Lam
(74) *Attorney, Agent, or Firm*—Synnestvedt & Lechner LLP

(57) ABSTRACT

A method and apparatus for providing noise immunity for binary signals being transmitted on a chip. A single signal is split into two complementary signals and transmitted from the transmitting portion to the receiving portion. At the receiving portion is a new type of flip-flop, termed a UV flip-flop, similar to an SR flip-flop, but having two memory states for input states 0-0 and 1-1. The Q output of the UV flip-flop is coupled to the receiving point. Since 0-0 and 1-1 are both memory states, positive and negative noise glitches will have no effect on the output of the UV flip-flop.

15 Claims, 4 Drawing Sheets

| S | R | Q | Q̄ |
|---|---|---|---|
| 0 | 0 | PREVIOUS STATE | |
| 0 | 1 | 0 | 1 |
| 1 | 0 | 1 | 0 |
| 1 | 1 | NOT ALLOWED | |

| $A_1$ | $B_1$ | $A_2$ | $B_2$ | |
|---|---|---|---|---|
| 0 | 0 | 0 | 0 | ⎫ |
| 0 | 1 | 0 | 1 | ⎬ UNCHANGED |
| 1 | 0 | 1 | 0 | ⎭ |
| 1 | 1 | 0 | 0 | ⎬ CHANGED TO 0-0 FROM 1-1 |

| U | V | Q | Q̄ |
|---|---|---|---|
| 0 | 0 | PREVIOUS STATE | |
| 0 | 1 | 0 | 1 |
| 1 | 0 | 1 | 0 |
| 1 | 1 | PREVIOUS STATE | |

| NOISE TYPE | BEFORE NOISE | | | | AFTER NOISE | | | |
|---|---|---|---|---|---|---|---|---|
| | S | U | V | Q | S | U | V | Q |
| ∧ | 1 | 1 | 0 | 1 | 1 | 1 | 1 | 1 |
| ∨ | 1 | 1 | 0 | 1 | 1 | 0 | 0 | 1 |
| ∧ | 0 | 0 | 1 | 0 | 0 | 1 | 1 | 0 |
| ∨ | 0 | 0 | 1 | 0 | 0 | 0 | 0 | 0 |

METHOD AND APPARATUS FOR PROVIDING NOISE IMMUNITY FOR A BINARY SIGNAL PATH ON A CHIP

FIELD OF THE INVENTION

The invention pertains to the provision of noise immunity for binary signals on an integrated circuit chip.

BACKGROUND OF THE INVENTION

There are many potential sources of noise that can corrupt data being transmitted on a transmission path on an integrated circuit chip. These sources of noise include both on-chip sources and off-chip sources. For instance, phase locked loops (PLLs) tend to be very noisy. Strong drivers, such as data and address bus drivers also create significant noise. For example, an address bus may need to drive the pins of a chip, and therefore would tend to have a strong and, therefore, noisy driver. When all or at least a significant number of bits on an address bus switch states simultaneously, a large burst of very short duration noise is created that could affect and corrupt data on nearby lines on the chip. Accordingly, it is typically a design objective to avoid running transmission paths near high noise devices or zones on the chip. However, sometimes this is impossible.

Further, noisy devices from off-chip also can corrupt data on the chip through electric and/or magnetic coupling.

A noise burst can cause a state change of a binary signal passing through an affected path on the chip, thus corrupting the data. A noise burst that temporarily raises the voltage on an affected transmission path during the transmission of a binary 0 bit on that path can cause the bit to be received at the receiving end as a binary 1. A noise burst that temporarily lowers the voltage on an affected transmission path during the transmission of a binary 1 bit on that path can cause the bit to be received as a binary 0.

A noise burst that raises the voltage on a path enough to cause a binary 0 being transmitted on a noise affected path to temporarily appear as a binary 1 is herein termed a positive noise glitch. Similarly, a noise burst that lowers the voltage on a path enough to cause a binary 1 being transmitted on a noise affected path to temporarily appear as a binary 0 is herein termed a negative noise glitch. It should be clear that a positive glitch generally should not affect the validity of a transmitted binary 1 because raising the voltage on a path during transmission of a binary 1 will still cause it to be received as a binary 1. Likewise, a negative glitch generally should not affect the validity of a transmitted binary 0 because lowering the voltage on a path during transmission of a binary 0 will still cause it to be received as a binary 0.

It is desirable to make digital (i.e., binary) signals on chips immune to such noise.

SUMMARY OF THE INVENTION

The present invention makes binary transmission lines on a chip immune to positive and negative noise glitches. The invention comprises providing two complementary lines rather than a single line for each data transmission path through potentially noisy chip areas. Accordingly, a signal generated in one area of the chip is split and transmitted over two transmission lines to the receiving chip component. The data on one of the two paths is inverted at the beginning of the transmission path or at least prior to entering the noisy area of the chip. At the receiving end, a new type of flip-flop, herein termed a UV flip-flop, receives the two complementary signals at its U and V inputs, respectively.

The UV flip-flop of the present invention operates similar to an SR flip-flop except that there are two memory states rather than one, namely 0-0 at the U and V inputs, respectively, and 1-1 at the U and V inputs, respectively. Accordingly, in the absence of noise, a transmitted binary 1 is received as 1-0 at the U and V inputs, respectively, and a transmitted binary 0 is received as 0-1 at the U and V inputs, respectively. The Q or $\overline{Q}$ output of the UV flip-flop is then fed to the receiving circuit component as the received binary bit.

Since the two lines are supposed to be complementary, receipt of a 0-0 at the U and V inputs could only be the result of a negative noise glitch on one or both of the paths. Likewise, receipt of a 1-1 could only be the result of a positive noise glitch on one or both of the paths. However, since 0-0 and 1-1 are both memory states, noise glitches of a duration short enough to occur entirely within the duration of a single binary symbol (1 or 0) will have no effect on the output of the UV flip-flop. Accordingly, the output of the UV flip-flop is noise immune with respect to short duration positive and negative noise glitches.

It can be seen from the discussion above that it is assumed herein that any given noise glitch affects both of the complementary lines simultaneously. However, it should be understood that a noise glitch affecting only one of the lines is still corrected by the present invention. The only problematic situation would be if a negative noise glitch occurred on one of the complementary lines carrying a binary 1 and a positive noise glitch occurred on the other line carrying a binary 0. However, if the two complementary lines are run adjacent and parallel to each other on the chip, this is a very unlikely situation.

The UV flip-flop of the present invention has many potential embodiments. However, from a conceptual standpoint it can be considered an SR flip flop preceded by a front end circuit that converts the illegal 1-1 input state to a memory state (i.e., the output will remain at its previous state responsive to a 1-1 condition at its two input terminals). For a NOR-gate realized SR flip-flop, the front-end circuit may comprise two AND-gates, the first one having its first input coupled to the first of the complementary signal paths and its second input coupled to the inverse of the second of the complementary signal paths. The second AND-gate has a first input coupled to the inverse of the first of the complementary signal paths and a second input coupled to the second of the complementary signal paths. The outputs of the first and second AND-gates are coupled, respectively, to the S and R inputs of a normal SR flip-flop.

This front end circuit has no affect with respect to input conditions 0-0, 1-0 and 0-1 on the complementary input lines. However, it converts a 1-1 input signal to a 0-0 output signal, thus causing the 1-1 input state to the UV flip-flop to also be a memory state.

DETAILED DESCRIPTION OF THE PRESENT INVENTION

Figure 1:
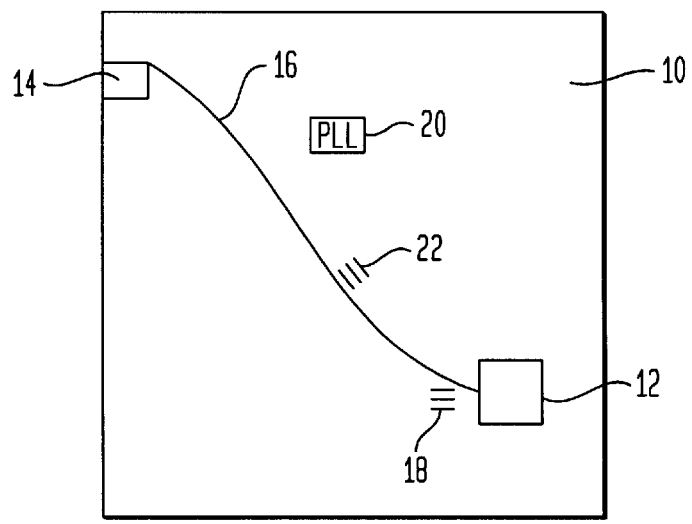
FIG. 1 is a partial-block/partial-pictorial diagram illustrating components of an integrated circuit chip of the prior art.

FIG. 1 is a partial-pictorial/partial-block diagram of an integrated circuit chip 10 of the prior art. The chip 10 contains various processing sections such as processing block 12 which operates on data and generates a binary signal which is to be transmitted to another area of the chip, such as output pad 14, via a transmission path 16 on the chip. As illustrated in FIG. 1, that conducting path may need to travel a long distance on the chip and pass near one or more high noise generating circuit portions on the chip. Typical high noise generating components on a chip might comprise a high bit count parallel plane bus 18, a phase locked loop 20, or potentially any other closely adjacent signal path 22, particularly if it is being driven by a powerful driver.

These types of devices and others can create noise glitches that may corrupt a binary symbol being transmitted on conducting path 16. For instance, if all or most of the lines on bus 18 switch at the same instant from logic 0 to logic 1, it can create a noise glitch that will convert a digital 0 being transmitted on line 16 to be received as a digital 1 at the receiving block or vice versa. Likewise, if all or most of the lines on bus 18 switch at the same instant from logic 1 to logic 0, it can create a noise glitch that will convert a digital 1 being transmitted on line 16 to be received as a digital 0 at the pad 14 or vice versa.

Figure 2:
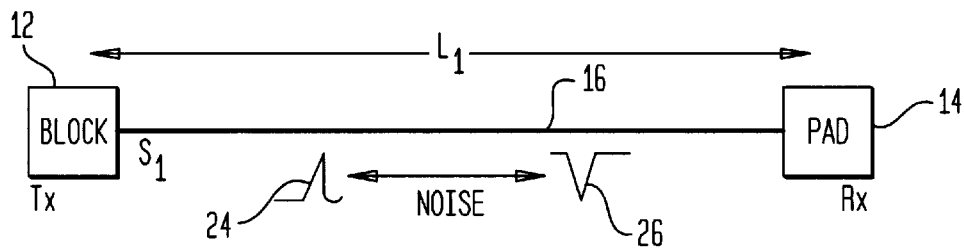
FIG. 2 is an illustrative diagram showing how noise on an integrated circuit chip of the prior art can affect binary signals being transmitted on wire traces on the chip.

FIG. 2 is a graphical representation to help illustrate the effect of a noise glitch on binary symbols traveling on transmission path 16 between a first, signal-generating block, e.g., processing block 12, and a second signal-receiving block, e.g., pad 14, of FIG. 1. We will assume that a valid binary bit signal is generated at block 12 that is to be transmitted to pad 14 over path 16 having length L1 which is subject to noise interference. We also will assume that a digital 0 is represented on this chip as a voltage level of zero for 20 nanoseconds and a digital 1 is represented as a pulse of the same duration of 5 volts.

As illustrated in FIG. 2, a positive noise glitch such as illustrated at 24 can convert a 0 to a 1 by increasing the voltage temporarily on line 16. Likewise, a negative noise glitch such as illustrated at 26 can convert a binary 1 on line 16 to a binary 0 by decreasing its voltage.

Figure 3:
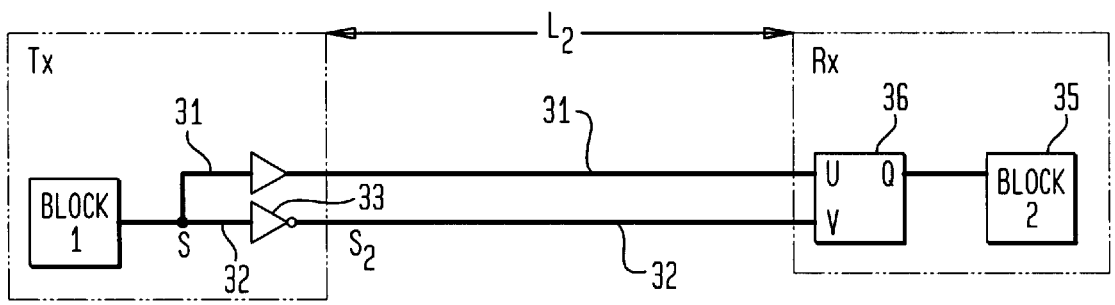
FIG. 3 is a block diagram illustrating data transmission on a chip in accordance with the present invention.

FIG. 3 is a partial block/partial pictorial diagram similar to FIG. 2 but illustrating data transmission on a chip in accordance with the present invention. Particularly, within or immediately adjacent to the transmitting block 30, the outgoing binary signal of interest is split onto two lines 31 and 32. One of the lines 32 is inverted by inverter 33 and the state on the other line 31 is left unchanged. As illustrated in FIG. 3, the unchanged line 31 may go through an amplifier 34 in order to keep it consistent in power and delay time with the signal on the inverted line 32. Accordingly, the binary symbol sent out over the noise-prone path L2 to the receiving block 35 comprises two complementary signals on lines 31 and 32. At the receiving block 35, the receiving component is preceded by a new type of flip-flop 36, herein termed a UV flip-flop. The UV flip-flop 36 is coupled to receive the uninverted path 31 at its U input terminal and the inverted path 32 at its V input terminal.

The new UV flip-flop is similar to an SR flip-flop in function, except that it has two memory states and no illegal states. The logic table of this device is given in FIG. 6B.

Figures 6A, 6B, 7:
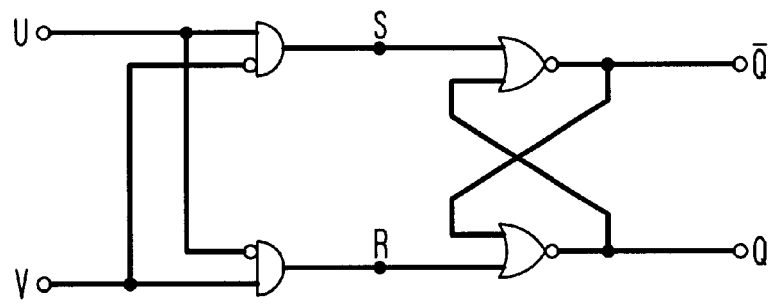
FIG. 6A is a combinational logic diagram of a UV flip-flop in accordance with the present invention.
FIG. 6B is a logic table illustrating the operation of the circuit of FIG. 6A.
FIG. 7 is a table illustrating the noise immunity of signal paths on an integrated circuit chip constructed in accordance with the present invention.

As shown in FIG. 6B, 0-0 and 1-1 at the U and V inputs, respectively, are both memory states. That is, in response to either of those two input conditions, the Q and $\overline{Q}$ outputs simply maintain their preceding state. A 1-0 presented at the U and V inputs, respectively, causes the Q output to be 1 and the $\overline{Q}$ output to be 0. A 0-1 presented at the U and V inputs, respectively, causes the Q output to be 0 and the $\overline{Q}$ output to be 1.

Thus, in the absence of noise, a binary 0 generated at block 30 should be received at the U and V inputs, respectively, of the UV flip-flop 36 as a binary 0 at the U input and a binary 1 at the V input. Likewise, a binary 1 transmitted in the absence of noise will be received as 1 and 0 at the U and V inputs, respectively, of the UV flip-flop 36. Accordingly, the Q output of the UV flip-flop will be the value originally generated at the transmitting block. Therefore, the Q output is coupled to input terminal of the receiving block 35.

It should be clear that, in the absence of noise or other error, either 0-1 or 1-0 should be received at the U and V inputs of the flip-flop 36, respectively. However, as previously mentioned, a positive noise glitch will convert a binary 0 to a binary 1, but not affect a binary 1. Accordingly, a positive noise glitch will cause 1-1 to be received temporarily at the U and V inputs, respectively, of the flip-flop 36 regardless of what data was actually transmitted. Likewise, a negative noise glitch will cause 0-0 to be received temporarily at the U and V inputs, respectively, of the flip-flop 36 regardless of what was actually transmitted.

The UV flip-flop 36, however, upon receipt of either 0-0 or 1-1 at the U and V inputs, respectively, simply maintains its previous state. Accordingly, both positive and negative noise glitches will have no effect on the outputs, Q and $\overline{Q}$, of the flip-flop 36. Accordingly, the signal received at the receiving component 35 is noise immune to short-term noise glitches occurring during the transmission of a binary symbol.

It should be understood that this invention eliminates the effect of noise glitches occurring during the transmission of a single binary symbol. Long-term noise or noise occurring across a symbol boundary may still corrupt data since the UV flip-flop merely maintains the preceding value when it enters one of its memory states. Obviously, maintaining the preceding value during noise that exists across symbol boundaries does not guarantee the accuracy of the later symbol.

Figures 4A, 4B:
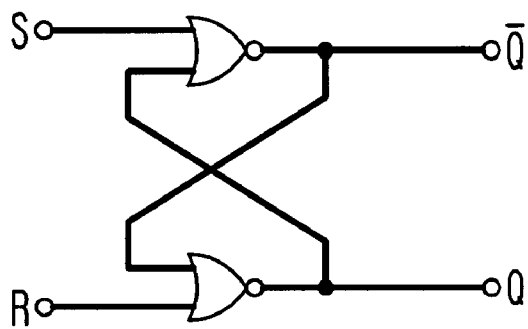
FIG. 4A is a combinational logic diagram of one exemplary implementation of an SR flip-flop of the prior art.
FIG. 4B is a logic table illustrating the operation of the SR flip-flop of FIG. 4A.

FIG. 4A is a combinational logic diagram of one possible realization of a standard SR flip-flop of the prior art (a NOR-gate implementation) and FIG. 4B is its logic table. As can be seen, 0-0 at the S and R inputs, respectively, is the memory state, i.e., the outputs simply remain in the previous state. It also can be seen that 1-1 at the S and R inputs of an SR flip-flop is an illegal state. It is unknown how the outputs will react to such a condition.

Figures 5A, 5B:
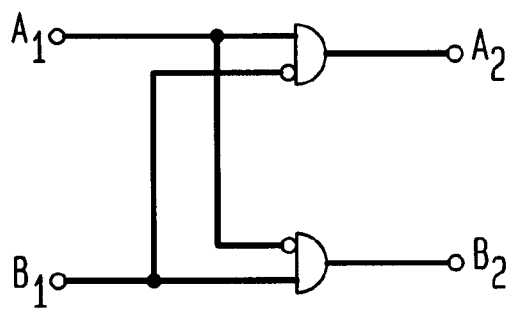
FIG. 5A is a combinational logic diagram of a front end circuit of a UV flip-flop in accordance with the present invention.
FIG. 5B is a logic table illustrating the operation of the circuit of FIG. 5A.

FIG. 5A is a combinational logic diagram of a front end circuit to be added to the front end of this type of SR flip-flop in order to create a UV flip-flop in accordance with the present invention. FIG. 5B is its logic table. As can be seen from FIGS. 5A and 5B, inputs of 0-0, 0-1, or 1-0 at the A1 and B1 inputs to this circuit produce identical outputs, namely 0-0, 0-1, or 1-0, respectively, at its outputs A2 and B2. However, this circuit converts 1-1 at the A1 and B1 inputs to 0-0 at the A2 and B2 outputs. Accordingly, placing this circuit in front of a NOR-gate type SR flip-flop converts what would otherwise be an illegal 1-1 input state to a 0-0 input state. This, in effect, makes the 1-1 input state a memory state, just like the 0-0 state.

FIG. 6A is a combinational logic diagram showing a UV flip-flop in accordance with the present invention, comprising the circuits of FIGS. 4A and 5A combined as described above. Its logic table is shown in FIG. 6B. Accordingly, the UV flip-flop of the present invention operates essentially as an SR flip-flop for inputs 0-0, 0-1, and 1-0. It alters the operation relative to an SR flip-flop by changing the 1-1 input state from an illegal state to a memory state.

FIG. 7 is a table illustrating the affect of positive and negative noise glitches on a transmitted binary 1 or binary 0. The left half of the table shows the situation in the absence of noise while the right half of the table shows the situation in the presence of noise. Row 1 illustrates the transmission of a digital 1 in the presence of a positive noise glitch. As shown in the left hand portion of the table, in the absence of noise, a 1 is received at the U input and a 0 is received at the V input at the receiving end. This causes the Q output to be a binary 1, as desired. Turning to the right hand portion of row 1, in the presence of noise, it is seen that a positive noise glitch will convert the 0 on line 38 to a 1. However, because 1-1 at the U and V inputs is a memory state, the Q output will remain at 1.

Row 2 illustrates the transmission of a digital 1 in the presence of negative noise glitch. As can be seen from the left hand portion of the table, in the absence of noise, the generation of a binary 1 at the transmitting block causes a 1 to be transmitted on line 31 to the U input of the UV flip-flop and a 0 to be transmitted on line 32 to the V input of the flip-flop. A negative noise glitch will convert the 1 on line 31 to a 0 and cause the UV flip-flop to receive 0-0 at its U and V inputs, respectively. However, because 0-0 is a memory state, the Q output will remain at 1. Rows 3 and 4, respectively, show the effect of a positive noise glitch and a negative noise glitch, respectively, on transmission of a binary 0 and should be self-explanatory in view of the preceding explanation.

Thus, it can be seen that noise glitches occurring during the transmission of a single binary symbol will have no effect on the data received at the receiving block.

It should be clear that the circuits shown in FIGS. 4, 5 and 6 are merely exemplary and that the UV flip-flop of the present invention can be designed with any number of combinational logic circuits having the same logic table as shown in FIG. 6B.

Having thus described a few particular embodiments of the invention, various alterations, modifications, and improvements will readily occur to those skilled in the art. Such alterations, modifications and improvements as are made obvious by this disclosure are intended to be part of this description though not expressly stated herein, and are intended to be within the spirit and scope of the invention. The foregoing description is by way of example only, and not limiting. The invention is limited only as defined in the following claims and equivalents thereto.

What is claimed is:

1. A method of transmitting a binary symbol on an integrated circuit chip comprising the steps of:
   (1) converting the symbol to a pair of complementary signals;
   (2) transmitting said complementary signals on first and second conductive paths on said integrated chip to a receiving point;
   (3) causing the complementary signals to be input to U and V inputs, respectively, of a UV flip-flop; and
   (4) coupling an output of said UV flip-flop to said receiving point.

2. A method as set forth in claim 1 wherein step (1) comprises:
   (1.1) placing said symbol on two separate nodes; and
   (1.2) passing said symbol on one of said nodes through an inverter.

3. A method as set forth in claim 2 wherein step (1) further comprises the step of:
   (1.3) passing said symbol on the other of said nodes through a circuit having the same amplification and delay characteristics as said inverter.

4. A method as set forth in claim 1 wherein step (3) comprises providing said UV flip-flop as an SR flip-flop preceded by a circuit t hat convert s an illegal state on said first and second conductive paths to a memory state at its outputs while leaving all other input conditions unchanged.

5. A method as set forth in claim 1 wherein step 1 is performed within or adjacent a location where said symbol is generated and step (3) is performed adjacent said receiving point.

6. A method as set forth in claim 1 wherein step (2) comprises providing said first and second conductive paths adjacent and parallel to each other.

7. An apparatus for providing noise immunity for a binary signal transmitted from a signal generating point on an integrated circuit chip to a signal receiving point on said integrated circuit chip comprising:
   first and second conductive paths on said integrated circuit chip coupled between said signal generating point and said signal receiving point;
   a logic inverter coupled within said second path;
   a UV flip-flop having a U input terminal coupled to said first conductive path and a V input terminal coupled to said inverter; and
   an output of said UV flip-flop coupled to said receiving point.

8. An apparatus as set forth in claim 7 further comprising a circuit within said first path having the same amplification and delay characteristics as said logic inverter.

9. An apparatus as set forth in claim 7 wherein said UV flip-flop comprises an SR flip-flop preceded by a circuit having first and second inputs coupled to said first and second conductive paths and first and second outputs coupled to S and R inputs, respectively, of said SR flip-flop, said circuit converting an illegal state for said SR flip flop at said first and second inputs to a memory state for said SR flip flop at said outputs, but leaving all other input states unchanged.

10. An apparatus as set forth in claim 9 wherein said circuit comprises first and second AND gates, said first AND gate having a first input coupled to said first conductive path, a second input coupled to receive an inverted version of said binary signal on said second path, and an output coupled to said S input terminal of said SR flip-flop, said second AND gate having a first input coupled to receive an inverted version of said binary signal on said first conductive path, a second input coupled to said second conductive path, and an output coupled to said R input terminal of said SR flip-flop.

11. An apparatus as set forth in claim 7 wherein said first and second conductive paths are parallel and adjacent to each other.

12. An apparatus as set forth in claim 11 wherein said logic inverter is adjacent said signal generating point and said UV flip-flop is adjacent said signal receiving point.

13. An apparatus for transmitting a binary symbol on an integrated circuit chip comprising:
   a signal source generating a binary symbol;
   a signal destination for said binary symbol;
   first and second paths on said integrated circuit chip coupled between said signal source and said signal destination;
   means, in said second signal path, for inverting said symbol;
   means, coupled between said first and second signal paths and said signal destination, for providing an output according to the following logic table

| First Path | Second Path | Output |
|---|---|---|
| 0 | 0 | PREVIOUS STATE |
| 0 | 1 | 0 |
| 1 | 0 | 1 |
| 1 | 1 | PREVIOUS STATE | whereby said symbol is immune to short duration noise glitches.

14. The apparatus of claim 13 wherein said first and second paths are adjacent and parallel to each other.

15. The apparatus of claim 13 wherein said means for inverting is adjacent said signal source and said means for providing an output is adjacent said signal destination.

* * * * *